(12) United States Patent
Johnson et al.

(10) Patent No.: US 7,132,903 B1
(45) Date of Patent: Nov. 7, 2006

(54) NOISE-SHIELDING, SWITCH-CONTROLLED LOAD CIRCUITRY FOR OSCILLATORS AND THE LIKE

(75) Inventors: Phillip Johnson, Hellertown, PA (US); Gary Powell, Allentown, PA (US); Harold Scholz, Allentown, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 228 days.

(21) Appl. No.: 10/613,460

(22) Filed: Jul. 3, 2003

(51) Int. Cl.
*H03L 1/00* (2006.01)
*H03B 27/00* (2006.01)

(52) U.S. Cl. .................. 331/185; 331/57; 331/186; 331/45; 327/272; 327/278; 327/254; 327/281

(58) Field of Classification Search ............. 331/57, 331/45, 17, 1 A, 185, 186; 327/272, 278, 327/264, 281, 254
See application file for complete search history.

(56) References Cited

U.S. PATENT DOCUMENTS

| | | | |
|---|---|---|---|
| 5,440,260 A * | 8/1995 | Hayashi et al. ............. | 327/278 |
| 6,150,862 A * | 11/2000 | Vikinski ..................... | 327/262 |
| 6,163,226 A * | 12/2000 | Jelinek et al. ............... | 331/57 |
| 6,191,630 B1 * | 2/2001 | Ozawa et al. ............... | 327/278 |
| 6,373,342 B1 * | 4/2002 | Tran .......................... | 331/57 |
| 2001/0045856 A1 * | 11/2001 | Ooishi ....................... | 327/277 |

* cited by examiner

*Primary Examiner*—Joseph Chang
(74) *Attorney, Agent, or Firm*—Steve Mendelsohn

(57) ABSTRACT

A set of interconnected delay stages, such as a voltage-controlled oscillator, has switch-controlled load circuitry connected to each output of each delay stage in the oscillator ring. In one embodiment, for each delay stage output, the switch-controlled load circuitry includes a switch, a transistor, and a current source. The switch is connected between the corresponding delay stage output and the transistor gate, the current source is connected between a power supply and the transistor drain, and the transistor source is connected to ground. In such a configuration, the transistor's gate-to-source capacitance can be applied to the corresponding delay stage output by closing the switch, for example, for lower-frequency operations. In addition, the output impedance of the current source decouples the capacitive load from the power supply, thereby substantially shielding the oscillator ring from noise in the power supply.

16 Claims, 2 Drawing Sheets

NOISE-SHIELDING, SWITCH-CONTROLLED LOAD CIRCUITRY FOR OSCILLATORS AND THE LIKE

TECHNICAL FIELD

The present invention relates to electronics, and, in particular, to oscillators, such as voltage-controlled ring oscillators, and the like.

BACKGROUND

FIG. 1 shows a schematic diagram of a prior-art voltage-controlled oscillator (VCO) 100 having a ring of three differential delay stages 102a–c, where the differential outputs OUTP, OUTN of stage 102a are cross-connected (i.e., in an inverting manner) to the differential inputs INN, INP of stage 102b, the differential outputs OUTP, OUTN of stage 102b are cross-connected to the differential inputs INN, INP of stage 102c, and the differential outputs OUTP, OUTN of stage 102c are connected (i.e., in a non-inverting manner) to the differential inputs INP, INN of stage 102a. With this configuration of delay stages, a signal applied to the INP input of stage 102a passes around the ring twice before reaching the OUTP output of stage 102c, which corresponds to the VCOP output of VCO 100. Similarly, a signal applied to the INN input of stage 102a passes around the ring twice before reaching the OUTN output of stage 102c, which corresponds to the VCON output of VCO 100.

When the sum of the phase delays and the overall gain imparted by the different delay stages around the ring are appropriate values, then stable oscillation will occur within the ring. For example, if each of the three delay stages 102 in VCO 100 imparts a 60-degree phase delay and if each delay stage 102 has a gain of 1, then the total signal delay for two passes around the ring will equal 360 degrees and stable oscillation will occur within VCO 100.

As shown in FIG. 1, the differential outputs VCON, VCOP of VCO 100 are tapped off the outputs OUTN, OUTP from delay stage 102c. The frequency of the differential output signal is a function of the magnitude of the voltage control signal CONTROL applied to each delay stage. The higher the magnitude, the higher the frequency, at least within the operating frequency range of the VCO.

In some VCOs, such as VCO 100 of FIG. 1, that have a relatively wide operating frequency range, additional loading is applied at the output of each delay stage for the lower frequencies, while such loading is not applied at the higher frequencies. To provide this additional loading, VCO 100 has switch-controlled load circuitry connected to the outputs of each stage 102.

In particular, connected between power supply vdd and each output OUTN, OUTP of each stage 102, VCO 100 has a transistor (i.e., a MOSFET) 104 and a switch 106, where each MOSFET is configured with its gate connected to one side of the switch and its source, drain, and bulk connected to vdd. In such a configuration, each MOSFET provides a load corresponding to the MOSFET's gate capacitance, which is selectively applied to the corresponding delay stage output by the corresponding switch.

As indicated in FIG. 1, when VCO 100 is to be operated at a relatively low frequency (e.g., a frequency less than a specified threshold frequency level) within the VCO's operating frequency range, the control signal LOWFREQUENCY causes all of switches 106 to close, thereby applying the additional capacitive load of MOSFET 104 to the corresponding delay stage output. On the other hand, when VCO 100 is to be operated at a relatively high frequency, the control signal LOWFREQUENCY causes all of switches 106 to open, thereby removing the additional capacitive load of MOSFET 104 from the corresponding delay stage output. In this way, stable oscillation can be achieved over the entire operating frequency range of VCO 100.

One problem with the design of VCO 100 is that, if there is noise in the power supply vdd (or, alternatively, in the local ground), that noise will pass easily through MOSFETs 104 and switches 106 to the oscillator ring and potentially corrupt the operation of VCO 100 with undesirable levels of jitter in the differential outputs VCON, VCOP resulting from unwanted modulation of the otherwise stable oscillation within the ring.

SUMMARY

Problems in the prior art are addressed in accordance with the principles of the present invention by an oscillator, such as a voltage-controlled ring oscillator, in which switch-controlled load circuitry is connected to the output of each delay stage in the oscillator ring. The switch-controlled load circuitry substantially shields the ring from noise in a power supply connected to the switch-controlled load circuitry. In preferred embodiments, for each delay stage output, the switch-controlled load circuitry (1) is connected between the power supply and the delay stage output and (2) comprises a current source, a capacitive load, and a switch, where the switch is adapted to selectively apply the capacitive load to the delay stage output. In one implementation, the capacitive load corresponds to a gate-to-source capacitance of a (e.g., NMOS) transistor, where one side of the switch is connected to the corresponding delay stage output, the other side of the switch is connected to the transistor gate, the transistor source is connected to ground, the transistor drain is connected to one side of the current source, and the other side of the current source is connected to the power supply (e.g., vdd). The switch enables the capacitive load provided by the transistor to be selectively applied to the corresponding delay stage output, e.g., for low-frequency operations. With such a configuration, the oscillator ring is substantially shielded from noise that may exist in the power supply.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments.

Figure 1:
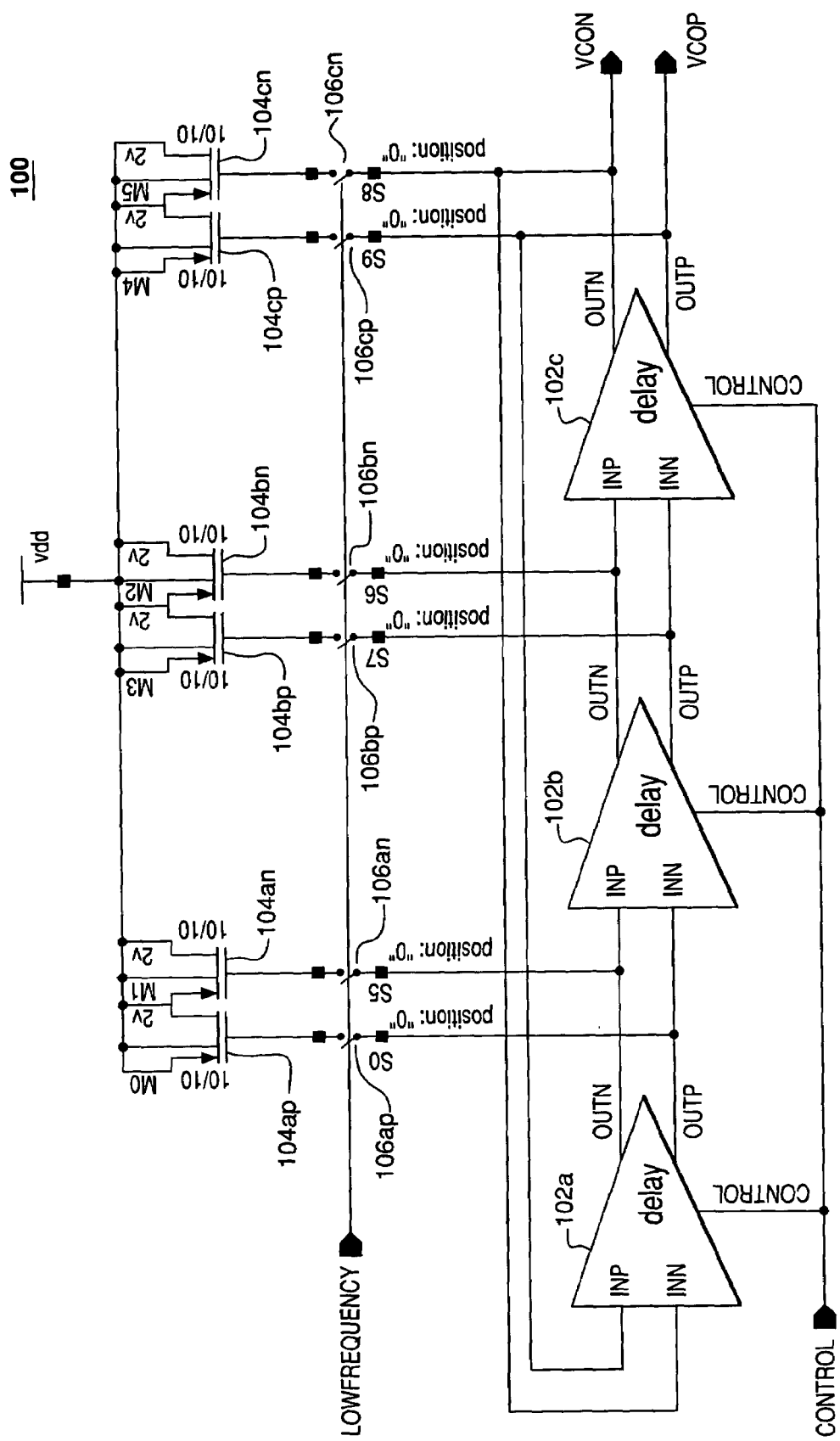
FIG. 1 shows a schematic diagram of a prior-art voltage-controlled oscillator (VCO)
Figure 2:
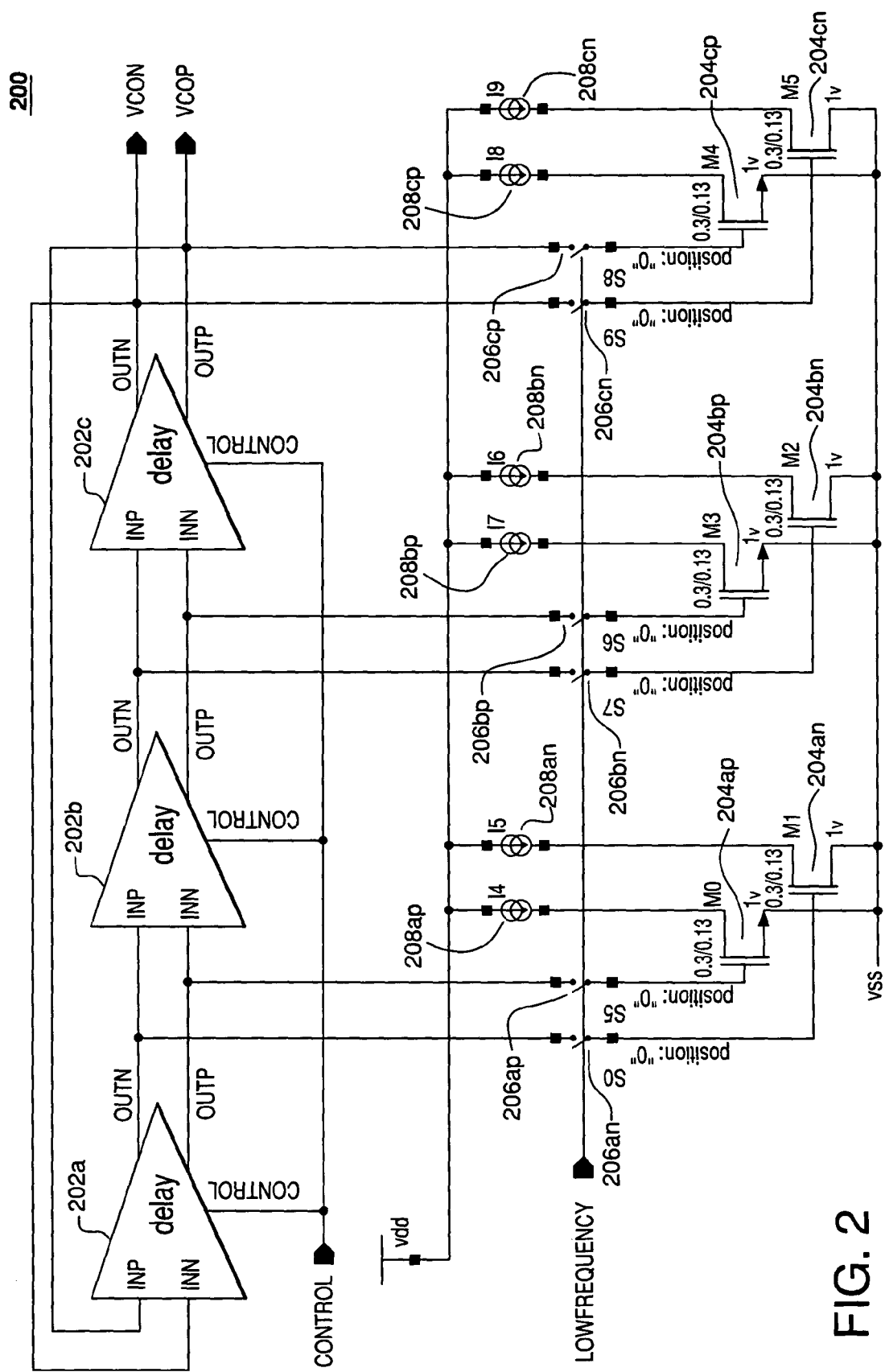
FIG. 2 shows a schematic diagram of a VCO according to one embodiment of the present invention.

FIG. 2 shows a schematic diagram of a voltage-controlled oscillator (VCO) 200 having a ring of three (e.g., differential) delay stages 202a–c, where the differential outputs OUTP, OUTN of each stage are connected to the corresponding differential inputs INP, INN of the next stage in the ring. Delay stages 202 are analogous to delay stages 102 of FIG. 1.

Like VCO 100 of FIG. 1, VCO 200 has switch-controlled load circuitry connected to the outputs of each stage 202, e.g., for lower-frequency operations within the operating frequency range of VCO 200. For each delay stage output OUTN, OUTP, the switch-controlled load circuitry comprises an (e.g., NMOS) transistor 204, a switch 206, and a (e.g., constant) current source 208 configured to selectively apply a load to the corresponding delay stage output, e.g., for the lower-frequency operations. Current source 208 can be any suitable type of current source, including, e.g., a PMOS current source or a cascode arrangement.

In particular, switch 206 is connected between the corresponding delay stage output and the transistor gate, current source 208 is connected between power supply vdd and the transistor drain, and the transistor source is connected to reference voltage vss (e.g., ground). In this configuration, the transistor's active gate-to-source capacitance (Cgs) is applied to the corresponding delay stage output when the corresponding switch is closed. If the NMOS transistor is considered to be in saturation, then Cgs will be approximately ⅔ that of a comparable NMOS transistor configured as a capacitor, like MOSFETs 104 of FIG. 1.

In preferred operations, when VCO 200 is to be operated at a relatively low frequency (e.g., a frequency less than a specified threshold frequency level) within the VCO's operating frequency range, the control signal LOWFREQUENCY causes all of switches 206 to close, thereby applying the additional capacitive load of transistor 204 to the corresponding delay stage output. When VCO 200 is to be operated at a relatively high frequency, the control signal LOWFREQUENCY causes all of switches 206 to open, thereby removing the additional capacitive load of transistor 204 from the corresponding delay stage output. In this way, stable oscillation can be achieved over the entire operating frequency range of VCO 200.

Moreover, with the configuration shown in FIG. 2, any noise occurring in power supply vdd will be substantially shielded from the oscillator ring by the switch-controlled load circuitry. In particular, such noise will not easily pass through current source 208, whose output impedance decouples the capacitive load from both the power supply and from local ground, thereby substantially shielding the oscillator ring from noise in either the power supply or the local ground. As such, jitter in the VCO output signals VCON, VCOP that results from such noise in prior-art VCOs, such as VCO 100 of FIG. 1, can be thereby reduced, providing a more stable, better operating VCO.

Alternative Embodiments

Although the present invention has been described in the context of a capacitive load being provided by a particular configuration of an NMOS transistor, the invention is not so limited. In other implementations, other configurations and/or other types of transistors can be used to provide a capacitive load. For example, rather than being configured such that the capacitive load corresponds to the transistor's gate-to-source capacitance, a transistor could be configured such that its gate-to-drain capacitance provides the capacitive load. Furthermore, instead of using PMOS current sources and NMOS loads, the invention could be implemented using NMOS current sources and PMOS loads. Moreover, the present invention could be implemented using loading other than or in addition to capacitive loading, such as inductive and/or resistive loading.

Although the present invention has been described in the context of ring oscillators having three differential delay stages, the invention is not so limited. In general, the invention can be implemented with any suitable number of stages as long as the total phase shift around the ring is an integer multiple of 360 degrees and the total gain around the ring is sufficiently close to 1. For example, in a preferred embodiment, the ring oscillator has four delay stages, each of which imparts a 45-degree phase shift and a gain of 1.

Moreover, oscillators of the present invention need not be implemented with differential delay stages. For example, the present invention could be implemented using full-swing inverter stages. Any set of devices that meets the gain and phase-shift requirements may be suitable for certain embodiments of the present invention.

Although the present invention has been described in the context of voltage-controlled ring oscillators in which a voltage-based control signal controls the gain of each stage in the ring, the invention is not so limited. The present invention may also be implemented in the context of other types of oscillators, including current-controlled ring oscillators in which a current-based control signal controls the gain of each stage in the ring. In addition, the invention could be implemented in the context of delay chains, such as those used in delay-locked loops (DLLs). In general, the present invention can be implemented in the context of any suitable set of interconnected delay stages.

Although the present invention has been described in the context of an oscillator in which switch-controlled load circuitry is connected to each differential output of each stage, it may be possible to implement the invention in an oscillator in which one or more stage outputs do not have such switch-controlled load circuitry. Furthermore, although the present invention has been described in the context of an oscillator in which all instances of the switch-controlled load circuitry are operated together based on a common control signal (i.e., LOWFREQUENCY of FIG. 2), the present invention could also be implemented with two or more—or even all—instances of the switch-controlled load circuitry operated individually based on different control signals.

It will be further understood that various changes in the details, materials, and arrangements of the parts which have been described and illustrated in order to explain the nature of this invention may be made by those skilled in the art without departing from the scope of the invention as expressed in the following claims.

We claim:

1. A circuit comprising:
   (a) a set of interconnected delay stages; and
   (b) switch-controlled load circuitry connected to the output of one or more delay stages, wherein the switch-controlled load circuitry substantially shields the delay stages from noise in a power supply connected to the switch-controlled load circuitry, wherein:
      for each delay stage output, the switch-controlled load circuitry (1) is connected between the power supply and the delay stage output and (2) comprises a current source, a load, and a switch, wherein the switch is adapted to selectively apply the load to the delay stage output;
      the load corresponds to a gate-to-channel capacitance of a transistor; and the transistor is connected to the switch at a transistor gate node and to the current source at a first transistor channel node.

2. The invention of claim 1, wherein the switch-controlled load circuitry is connected to the output of each delay stage.

3. The invention of claim 1, wherein the switch-controlled load circuitry selectively applies a load to the corresponding delay stage output.

4. The invention of claim 1, wherein the circuit is an oscillator and the plurality of delay stages are connected in a ring.

5. The invention of claim 4, wherein the oscillator is a voltage-controlled oscillator, wherein the gain of each delay stage is a function of an applied control voltage.

6. The invention of claim 1, wherein the impedance of the current source substantially decouples the load from the power supply.

7. The invention of claim 1, wherein the current source is a constant current source.

8. The invention of claim 1, wherein a second transistor channel node is connected to local ground.

9. The invention of claim 1, wherein the first transistor channel node is the transistor source.

10. The invention of claim 1, wherein:
the gate-to-channel capacitance corresponds to the gate-to-source capacitance of the transistor;
the current drain is connected to the transistor source; and
the transistor source is connected to local ground.

11. The invention of claim 1, wherein the transistor is an NMOS transistor.

12. The invention of claim 1, wherein:
each switch is adapted to be closed when an operating frequency of the circuit is below a specified threshold frequency; and
each switch is adapted to be open when the operating frequency of the circuit is above the specified threshold frequency.

13. The invention of claim 1, wherein:
the switch-controlled load circuitry is connected to the output of each delay stage;
the switch-controlled load circuitry selectively applies a capacitive load to the corresponding delay stage output;
the circuit is a voltage-controlled oscillator and the plurality of delay stages are connected in a ring, wherein the gain of each delay stage is a function of an applied control voltage;
the impedance of the current source substantially decouples the load from the power supply;
each switch is adapted to be closed when an operating frequency of the circuit is below a specified threshold frequency; and
each switch is adapted to be open when the operating frequency of the circuit is above the specified threshold frequency.

14. A voltage-controlled oscillator comprising:
(a) a set of interconnected delay stages; and
(b) switch-controlled load circuitry connected to the output of one or more delay stages, wherein the switch-controlled load circuitry includes a transistor, a switch connected between a delay stage output and a gate node of the transistor, and a current source connected between a power supply for the transistor and a channel node of the transistor.

15. The voltage-controlled oscillator of claim 14, wherein the transistor is an NMOS transistor, the current source is connected to the drain node of the NMOS transistor, and the load corresponds to the gate-to-source capacitance of the NMOS transistor.

16. The voltage-controlled oscillator of claim 14, wherein the current source comprises a PMOS transistor.

* * * * *